United States Patent [19]
Nakabu et al.

[11] Patent Number: 4,544,989
[45] Date of Patent: Oct. 1, 1985

[54] THIN ASSEMBLY FOR WIRING SUBSTRATE

[75] Inventors: Shigeo Nakabu, Nara; Yuji Matsuda, Yao; Hirokazu Yoshida, Osaka; Masaru Iwasaki, Izumisano; Takashi Nukii, Nara; Katunobu Awane, Ikoma, all of Japan

[73] Assignee: Sharp Kabushiki Kaisha, Osaka, Japan

[21] Appl. No.: 277,807

[22] Filed: Jun. 26, 1981

[30] Foreign Application Priority Data

Jun. 30, 1980 [JP] Japan ................................ 55-90128
Jun. 30, 1980 [JP] Japan ................................ 55-90129

[51] Int. Cl.$^4$ ............................................. H05K 1/18
[52] U.S. Cl. .................................... 361/401; 361/386; 357/81
[58] Field of Search ............... 174/68.5; 361/386, 401; 357/81

[56] References Cited

U.S. PATENT DOCUMENTS 3,249,818  5/1966  Hwang et al. ...................... 361/401
3,365,620  1/1968  Butler et al. .................... 361/401 X
3,614,832  10/1971 Chance et al. ..................... 174/68.5
3,622,384  11/1971 Davey et al. .................... 174/68.5 X
3,875,478  4/1975  Capstick ......................... 361/386 X
3,936,866  2/1976  Grossman et al. .................... 357/80
4,240,098  12/1980 Zory et al. ........................ 357/81 X
4,420,364  12/1983 Nukii et al. ..................... 174/68.5 X

FOREIGN PATENT DOCUMENTS 54-69394  4/1979 Japan ..................................... 357/81

OTHER PUBLICATIONS

Coombs et al., High Performance Package with Conductive Bonding to Chips, IBM Tech. Disc. Bull., V. 22, #10 Mar. 1980, pp. 4469 & 4470.
E. Stephens, Unit-Module Lead Frame Using Polyimide, IBM Tech. Disc. Bull., V. 11, #8, Jan. 1969, pp. 990 & 991.

Primary Examiner—R. R. Kucia
Attorney, Agent, or Firm—Birch, Stewart, Kolasch & Birch

[57] ABSTRACT

A substrate for wiring an electrical component in an electrical circuit comprises a base substrate, a first insulating layer of an organic material formed over the base substrate, a wiring member formed on the first insulating layer, coupled to the component, a second insulating layer of an organic material formed over the first insulating layer, and a terminal member on the first insulating layer and appearing from the second insulating layer, connected to the wiring member. A third insulating layer of an organic material may be interposed between the first and the second insulating layers, carrying a second wiring member connected to the first wiring member.

6 Claims, 23 Drawing Figures

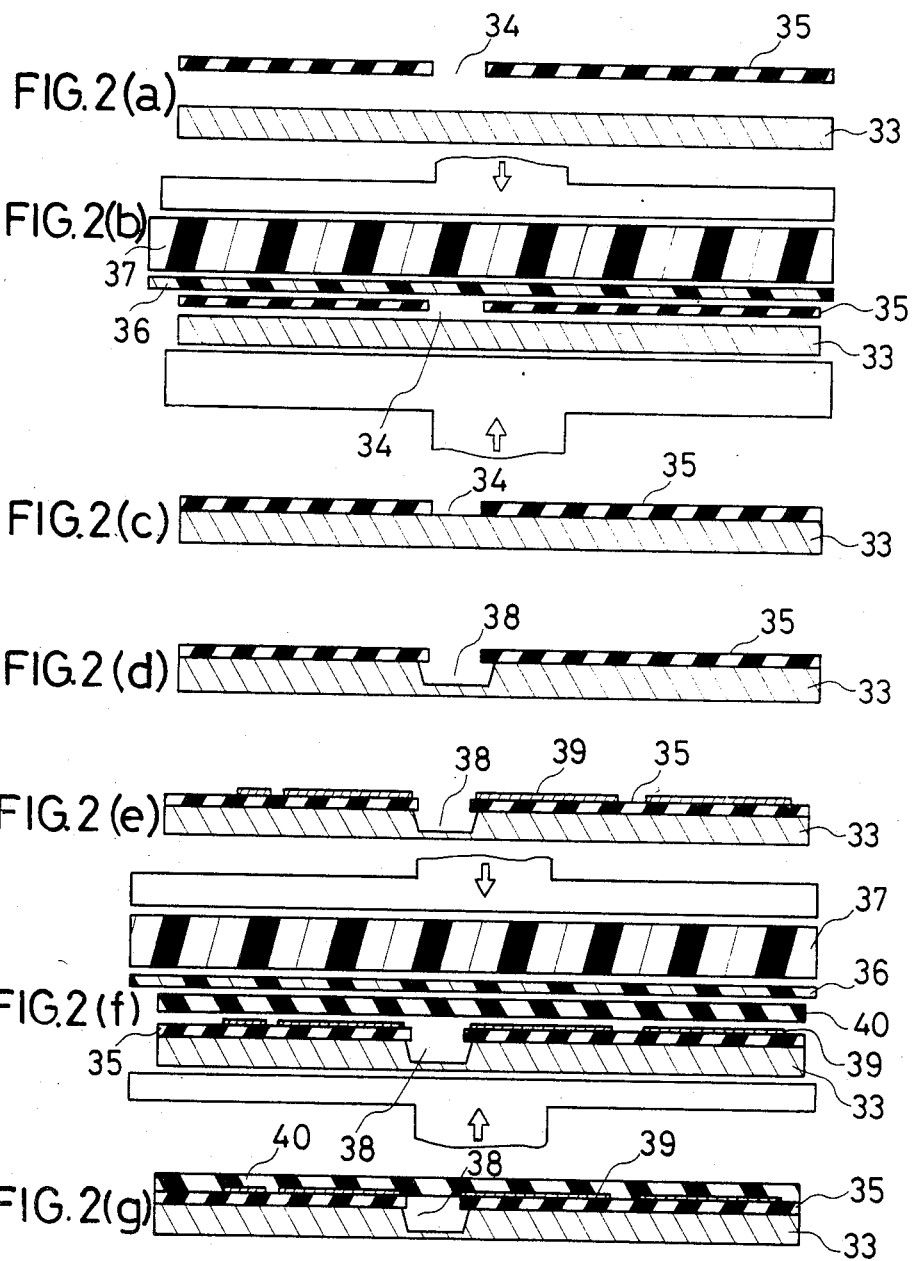

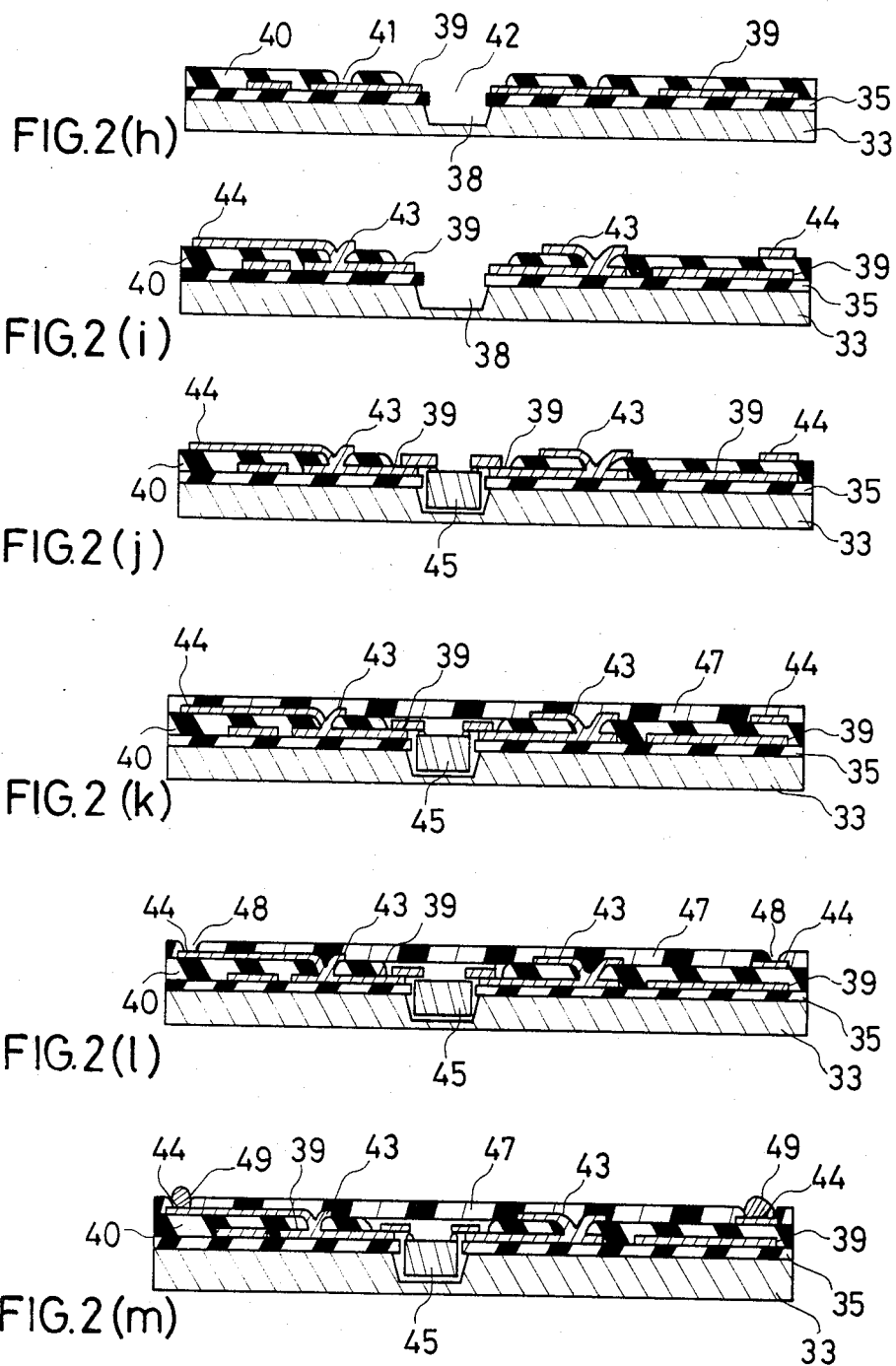

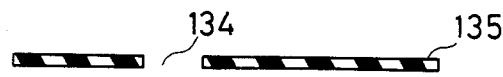
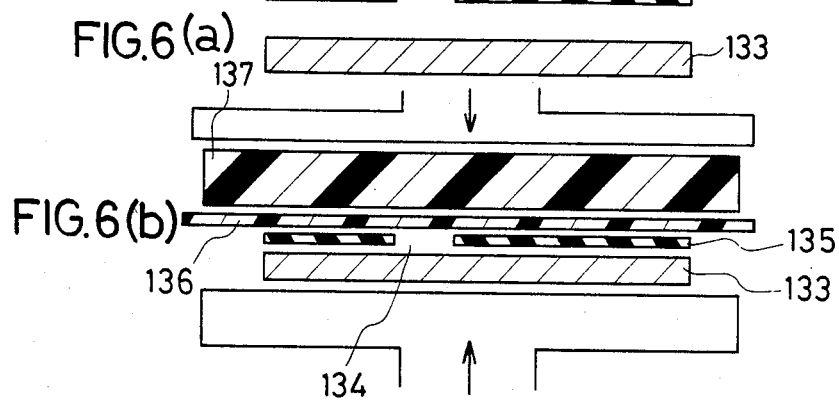
FIG.6(a)
FIG.6(b)
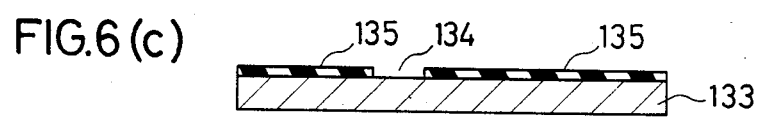
FIG.6(c)
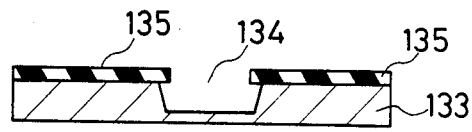
FIG.6(d)
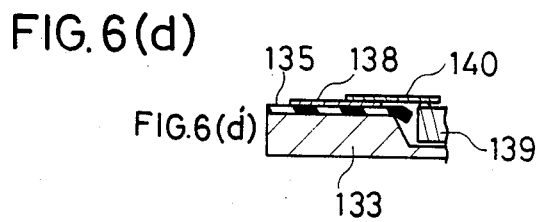
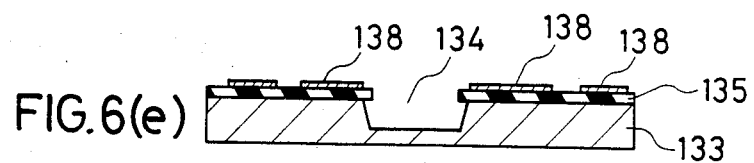
FIG.6(e)
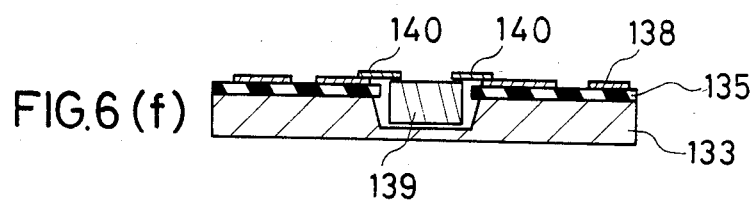
FIG.6(f)

THIN ASSEMBLY FOR WIRING SUBSTRATE

BACKGROUND OF THE INVENTION

The present invention relates to an assembly for a wiring substrate and, more particularly, to a sealing structure of such an assembly and a wiring connection between the assembly and an external circuit.

It has been difficult to make the conventional assembly for a wiring substrate thin. Such an assembly is typically comprised of a coating of synthetic resin over a device such as an IC disposed on a substrate so that the sum of the thicknesses of these elements defined a total thickness of the assembly. Even if each of these thicknesses was made as small as possible, it could not be expected to make a remarkably thin assembly.

Therefore, it is desired that the assembly for the wiring substrate be made remarkably thin.

SUMMARY OF THE INVENTION

Accordingly, it is an object of the present invention to provide an improved thin wiring assembly for accommodating a component such as an IC, an LSI, a resistor, a condenser, or a coil therein.

It is another object of the present invention to provide an improved thin wiring assembly for providing much limited connections for terminals.

Briefly described, in accordance with the present invention, a substrate for wiring an electrical component with an electrical circuit comprises a base substrate, a first insulating layer of an organic material formed over the base substrate, a wiring member formed on the first insulating layer, coupled to the component, a second insulating layer of an organic material formed over the first insulating layer, and a terminal member on the first insulating layer and appearing from the second insulating layer, connected to the wiring member. A third insulating layer of an organic material may be interposed between the first and second insulating layers, carrying a second wiring member connected to the wiring member.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIGS. 2(a) through 2(m) show steps for preparing the assembly as indicated in FIG. 1;

FIGS. 6(a) through 6(f) shows steps for preparing the assembly as indicated in FIG. 5.

DESCRIPTION OF THE INVENTION

Figure 1:
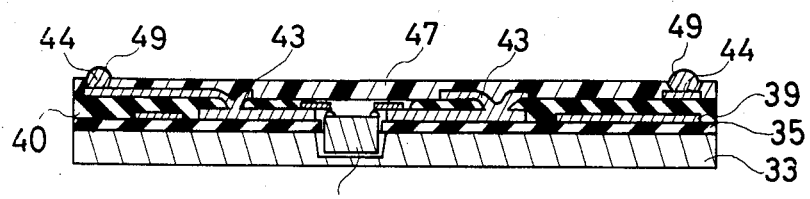
FIG. 1 shows a cross-sectional view of a thin wiring assembly according to the present invention.

With reference to FIG. 1, a thin wiring assembly of the present invention comprises a metallic substrate 33, an adhesive sheet 35, a lower wiring 39, an organic layer 40, an upper wiring 43, terminal electrodes 44, an organic film 47, a device 45 such as an IC (Integrated Circuit), an LSI (Large Integrated Circuit), a resistor, a condenser, a coil or so, and bump terminals 49.

This assembly is prepared as shown in FIGS. 2(a) through 2(m) according to the following steps.

FIGS. 2(a): A cleaned metallic base substrate 33 is provided which is composed of Al, Cu or the like. An insulating adhesive sheet 35 is provided for facing the substrate 33. The selected material for this sheet 35 may be a layer of polyamideimide, polyamicacid, fluorinated ethylene propylene (FEP) resin or the like all having adhesion or a polyimide resin film coated by any adhesive. A device aperture 34 for accomodating the device 45 is formed in the sheet 35 by punching, etching or the like.

FIG. 2(b): A protective sheet 36 is disposed over the upper surface of the insulating adhesive sheet 35. An elastic heat resistive resin 37 is interposed between the protecting sheet 36 and one of the edges of a pressing machine. The other of the edges is pressed onto the bottom of the base substrate 33 at elevated temperatures. In place of the provision of the insulating adhesive sheet 35, any adhesive in a liquid or a paste-like form can be coated by printing or roller coating or the like in which the adhesive on the device aperture 34 should be removed.

FIG. 2(c): Therefore, the insulating adhesive sheet 35 is adhered to the metallic base substrate 33, sheet 35 having the device aperture 34. The sheet 35 functions as an insulating layer the flat portions of which carries lower wiring elements.

FIG. 2(d): A portion of the base substrate 33 opposite to the device aperture 34 is removed by etching to form a device hole 38 for accommodating the device 45 therein. The sheet 35 is used as a mask.

FIG. 2(e): Any deposition technique, such as vacuum evaporation, ion-beam deposition including sputtering and ion-cluster, or the like is applied used to form lower wiring elements 39 on the sheet 35. The lower wiring elements 39 are preferably made of Al-Ni.Cu alloy in the form of a film. Wiring patterns for the lower wiring elements 39 can be prepared by one of the following steps:

(1) After a layer for the elements 39 is deposited over the entire surface of the sheet 35, any resist is coated over this layer. Photo etching is conducted to outline the elements 39.

(2) Any resist is coated over the surface of the sheet 35 to thereby prepare a predetermined pattern for the elements 39. Any materials for making the elements 39 is deposited and the resist is removed. This is known as the so-called lift-off method.

(3) After a layer for preparing the elements 39 is deposited over the entire surface of the sheet 35, any resist is coated for covering required portions of this layer. Etching is conducted to prepare a desired pattern of the elements 39.

In place of use of any deposition method as described above, it may be possible that a metallic foil in which the lower wiring elements 39 can be prepared is attached to layer 35.

FIG. 2(f): An organic layer 40 and the protective sheet 36 are pressed onto the above-prepared wiring sheet under elevated temperatures such as about 250° C. The elastic heat resistive resin 37 is used again so as to enable uniform pressing. The organic layer 40 has the capability of attaching to the upper surface of the lower wiring elements 39. Layer 40 may be selected to be a film made of polymide, coated with any adhesive. The protective sheet 36 is provided for protecting the organic layer 40. The organic layer 40 is adhered to the sheet 35 and the lower wiring elements 39. It is very insulative and has the capability of being subjected to etching treatment for preparing through holes.

Such a material for the organic layer 40 is not limited to a layer of polyimide on which any adhesive may be coated. Other materials may be a layer of polyamideimide, polyamicacid or the like having adhesion in a semi-hardened form, or a layer of fluorinated ethylene propylene resin (FEP resin) or the like having thermal plasticity. No use of any adhesive is required. Otherwise, any resin can replace the organic layer 40, the resin being in a liquid or a paste-like form and being coated by printing or roller coating or the like. FIG. 2(g): The above-prepared multi-layered wiring substrate is indicated shown.

FIG. 2(h): After a resist made of an organic material and an inorganic material is printed on the organic layer 40, a through-hole 41 and a device aperture 42 is prepared by using the resist as a mask with $O_2$ plasma etching. Use of a combined resist of any organic material and any inorganic material as a mask advantageous in that while the organic layer 40 is subjected to plasma etching, the organic material included within the combined resist is also subjected to the etching so that a gentle slope is produced around the through hole 41 so as to form a stable connection with the through hole 41.

In place of the plasma etching, wet etchings with hydrazine, NaOH etc. can be applied. In such a case, great care should be taken so that the lower wiring elements 39 are not damaged while the material of the organic layer 40 is subjected to the wet etching. By virtue of the plasma etching, any organic material is etched by the $O_2$ plasma in which case a film of polyimide coated with any adhesive is advantageously used. But, the wet etching can not etch any adhesive.

FIG. 2(i): Any deposition such as ion-beam deposition is conducted to form upper wiring elements 43 and a through-hole contact of a metallic film through the through-hole 41. The metallic film reaches the lower wiring elements 39. Simultaneously, terminal electrodes 44 are formed for leading to external terminals. Each of the upper wiring elements 43 and the terminal electrodes 44 is made of three-layered metallic films consisting of layers of Al, Ni and Au or two-layered metallic films consisting of combinations of Al and Ni, and Ni-Cu alloy, Cr and Ni, Cr and Ni, or Cr and Ni-Cu alloy. The two layers consisting of Al and Ni-Cu alloy are preferable in that the layer of Al has the capability of attaching to the organic layer 40 and the layer of Ni provides good contact with a soldering material which is used later.

Each of the upper wiring elements 43, the terminal electrodes 44 and the lower wiring elements 39 consists of an evaporated film for providing adhesion to the organic layer 40, 35 or 47 and at least one other evaporated film for providing good contact with one of the surrounding layers.

Each wiring pattern for the upper wiring elements 43 and the terminal electrodes 44 can be made by one of the above methods (1) to (3) described in connection with FIG. 2(e).

According to a preferred form of the present invention, the device 45 is electrically communicated to the wiring substrate with a soldering material as a system of mounting the device on a flexible carrier as disclosed in Aird, U.S. Pat. No. 3,763,404, for example. Therefore, the soldering material is printed between the connected portions. The connected portions may be selected to be close to the upper wiring elements or to the lower wiring elements. The connected portion is selected to be around the lower wiring elements 39 in the following manner.

FIG. 2(j): Within the device hole 38, the device 45, not subjected to any forming procedures, is disposed in the system of the flexible carrier mounted form. The top surface of the device 45 does not extend beyond the wiring substrates. Forming less outer-lead bonding is applied to the wired pattern to complete a circuit. Thermal press bonding or an Au-Su eutectic crystal can be selected depending on the material of the leading elements and wiring elements.

If good heat conduction is to be obtained, a diebonding with a conductive paste or the like can be used. It may be possible that the device 45 is of beam-lead chip and two or more devices are connected.

FIG. 2(k): Over the wiring substrate carrying the device 45, an organic layer 47 is adhered under pressure at an elevated temperature. It is necessary for it to be able to adhere to the wiring substrate under pressure at the elevated temperature and to be subjected to working by plasma etching or so. Preferably, this layer 47 should be selected to be one of a layer of polyimide coated with any adhesive, a layer of polyamideimide, polyamicacid and the like having adhesion in a semi-hardened from and a film of fluorinated ethylene propylene resin (FEP resin) or the like having thermal plasticity. Otherwise, any resin can replace the organic layer 47, the resin being in a liquid or a paste-like form and being coated by printing or roller coating or the like.

The above-described pressing method can be called a pressing process with a flat board. Any laminating element can be used to enable the pressing.

The thus prepared wiring subtrate comprises the upper and the lower wiring elements 39 and 43, and the device 45 all of which can be completely isolated from the atmosphere. The thickness of each of the organic layers 35, 40 and 47 is in the order of several to ten $\mu$m. The device 45 is thin enough to be buried within the wiring substrate.

The organic layer 40 can be adhered to the sheet 35 by roller pressing method.

FIG. 2(l): A resist is disposed over the organic layer 47 as a mask. The plasma etching is conducted to remove the film over the terminal electrode 44 and to form terminal holes 48 for accomodating terminals. The wiring substrate is dipped in a soldering liquid so that soldering bumps 49 are formed on the terminal electrodes 44. The terminal electrodes 44 to provide good contact with the soldering liquid enough to form the soldering bumps 49.

The distance between the terminal electrodes 44 is dependent on the accuracy of resist printing and an amount of over-etching by the plasma etching. Our experiments showed that the distance can be as narrow as about 350 $\mu$m while in a conventional device it is in the order of about 0.8 mm. Hence, a great number of leading connectors can be provided.

Needless to say, any lead frame can be bonded by soldering to the soldering bumps 49.

FIG. 2(m): The thus prepared wiring substrate is completed as shown in FIG. 2(m) which is identical with that of FIG. 1.

The organic layer 40 and the upper wiring elements 43 can be omitted in another example of the wiring substrate, in which case the lower organic layer 35 and the organic layer 47 are disposed in such a manner that the terminal electrodes 44 are directly bonded to the lower wiring elements 39.

Figure 3:
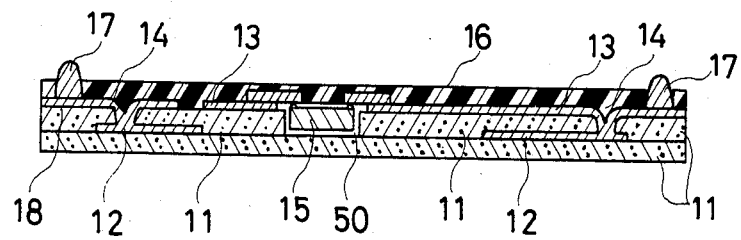
FIGS. 3 to 5 show cross-sectional views of other thin wiring assemblies according to the present invention.

FIG. 3 shows a cross-sectional view of still another example of wiring substrate according to the present invention. This wiring substrate comprises ceramic layers 11, lower wiring elements 12, upper wiring elements 13, through-holes 14, a device 15, an organic layer 16 as described above, soldering bumps 17, terminal electrodes 18, and a device hole 50.

This substrate can be prepared in the above-mentioned manner.

Figure 4:
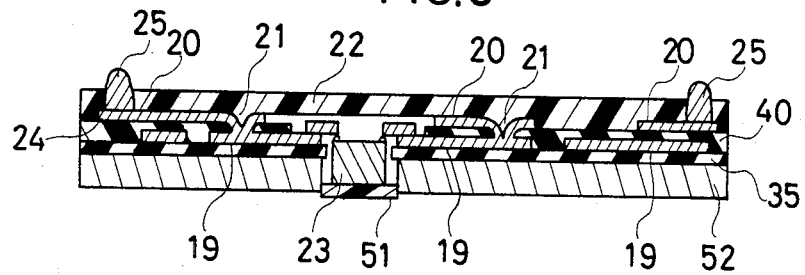

FIG. 4 shows a cross-sectional view of a further example of wiring substrate in accordance with the present invention. This wiring substrate comprises lower wiring elements 19, upper wiring elements 20, through-holes 21, organic layers 35, 40 and 22, a device 23, terminal electrodes 24, soldering bumps 25, a resin substrate 51, and a metallic or cermanic substrate 52. In this example, the device hole is a through-hole covered by the resin substrate 51.

Figure 5:
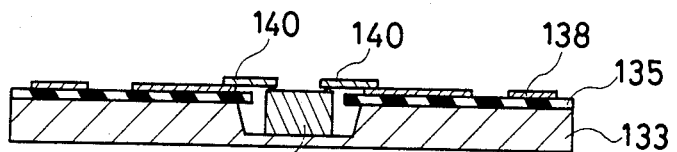

FIG. 5 shows a cross-sectional view of a further example of wiring substrate according to the present invention. FIGS. 6(a) through 6(f) show manufacture steps of the substrate of FIG. 5.

With reference to FIG. 5, a thin wiring assembly of the present invention comprises a metallic substrate 133, an adhesive sheet 135, a lower wiring 138, a device 139 such as an IC, an LSI, a resistor, a condenser, a coil or so, and connection terminals 140.

This assembly is prepared as shown in FIGS. 6(a) through 6(f) according to the following steps.

FIG. 6(a): A cleaned metallic base substrate 133 is provided which is composed of Al, Cu or the like. An insulating adhesive sheet 135 is provided for facing the substrate 133. The selected material for this sheet 135 may be a layer of polyamideimide, polyamicacid, fluorinated ethylene propylene (FEP) resin or the like all having adhesion or a polyimide resin film coated with any adhesive. A device aperture 134 for accomodating the device 139 is formed in the sheet 135 by punching, etching or the like.

FIG. 6(b): A protecting sheet 136 is disposed over the upper surface of the insulating adhesive sheet 135. An elastic heat resistive resin 137 is interposed between the protecting sheet 136 and one of edges of a pressing machine. The other of the edges is pressed onto the bottom of the base substrate 133 at elevated temperatures. In place of the provision of the insulating adhesive sheet 135, any adhesive in a liquid or a paste-like form can be coated by printing or roller coating or the like in which the adhesive on the device aperture 134 should be removed.

FIG. 6(c): Therefore, the insulating adhesive sheet 135 is adhered the metallic base substrate 133, including the device aperture 134. The sheet 135 functions as an insulating layer the flat portion of which carries lower wiring elements.

FIG. 6(d): A portion of the base substrate 133 opposite to the device aperture 134 is removed by etching to form a device hole 138 for accommodating the device 139 therein. The sheet 135 is used as a mask.

FIG. 6(d'): When the device hole 134 is etched using as a mask the sheet 135, over-etching of the device hole 134 results so that the edge of the sheet is within the device hole 134. This edge functions to prevent short circuiting between the edge of the metallic base substrate 133 at the side of the device hole 134, and the connection terminal 140 and, if any, wire-bonding elements.

FIG. 6(e): A deposition technique, such as vacuum evaporation, ion-beam deposition including sputtering and ion-cluster, or the like is applied to form lower wiring elements 138 on the sheet 135. The lower wiring elements 138 are preferably made of Al·Ni·Cu alloy in the form of a film. Wiring patterns for the lower wiring elements 138 can be prepared by one of the following methods:

(1) After a layer for the elements 138 is deposited over the entire surface of the sheet 135, any resist is coated over this layer. Photo etching is conducted to outline the elements 138.

(2) A resist is coated over the surface of the sheet 135 to thereby prepare a predetermined pattern for the elements 138. Material for making the elements 138 is deposited and the resist is removed. This is known as the so-called lift-off method.

(3) After a layer for preparing the elements 138 is deposited over the entire surface of the sheet 135, any resist is coated for covering required portions of this layer. Etching is conducted to prepare a desired pattern of the elements 138.

In place of use of any deposition method as described above, it may be possible that a metallic foil which the lower wiring elements 138 can be prepared is attached to sheet 135.

FIG. 6(f): According to a preferred form of the present invention the device 139 is electrically communicated to the wiring substrate with a soldering material as a means of mounting the device on a flexible carrier. Therefore, the soldering material is printed between the connected portions. The connected portions may be selected to be close to the lower wiring elements. The connected portion is selected to be around the lower wiring elements 138 in the following manner.

Within the device hole 134, the device 139, not subjected to any forming procedures, is disposed in which it is in the system of the flexible carrier mounted form. The top surface of the device 139 does not extend beyond the wiring substrates. Forming less outer-lead bonding is applied to the wired pattern to complete a circuit. Thermal press bonding or an Au-Su eutectic crystal can be selected depending on the material of leading elements and wiring elements.

If good heat conduction is to be obtained, a diebonding with a conductive paste or the like can be used. It may be possible that the device 139 is of wire-bonding, beam-lead chip, and two or more devices are connected.

Desirably, an additional layer of an organic material is provided for covering the thus-prepared wiring substrate.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A thin device for attaching and electrically connecting an electrical component to an external circuit, comprising:

a substrate;

an aperture within said substrate for accommodating said electrical component therein;

a first insulating layer of organic material formed over said substrate, said first insulating layer having an opening therein in a position corresponding to said aperture in said substrate, said first insulating layer extending within an area defined by said aperture;

first wiring means comprising a pattern of electrical circuit paths deposited on said first insulating layer;

means for connecting said first wiring means to said electrical component;

a second insulating layer of organic material formed over said first insulating layer and said first wiring means;

second wiring means comprising a pattern of electrical circuit paths deposited on said second insulating layer;

said second insulating layer comprising holes therein at positions corresponding to circuit paths of said first wiring means and said second wiring means comprising portions thereof extending through said holes into electrical contact with said first wiring means;

a third insulating layer of organic material formed over said second insulating layer and said second wiring means;

said third insulating layer comprising a plurality of holes therein at positions corresponding to circuit paths of said second wiring means, and a plurality of solder terminals in electrical contact with said second wiring means and extending through said holes in said third insulating layer for connecting said device to an external circuit, the distance between said terminals being substantially 350 microns.

2. A thin device for mechanically attaching and electrically connecting an electrical component to an external circuit, comprising:

a substrate;

an aperture within said substrate for accommodating said electrical component therein;

a first insulating layer of organic material formed over said substrate, said first insulation layer having an opening therein in a position corresponding to said aperture in said substrate;

first wiring means comprising a pattern of electrical circuit paths deposited on said first insulating layer;

means for connecting said first wiring means to said electrical component;

a second insulating layer of organic material formed over said first insulating layer and said first wiring means;

second wiring means comprising a pattern of electrical circuit paths deposited on said insulating layer;

said second insulating layer comprising holes therein at positions corresponding to circuit paths of said first wiring means and said second wiring means portions thereof extending through said holes into electrical contact with said first wiring means;

a third insulating layer of organic material formed over said second insulating layer and said second wiring means;

said third insulating layer comprising a plurality of holes therein at positions corresponding to circuit paths of said second wiring means, and a plurality of solder terminals in electrical contact with said second wiring means and extending through said holes in said third insulating layer for connecting said device to an external circuit, the distance between said terminals being on the order of microns.

3. The device of claim 2, wherein at least one of the first insulating layer, the second insulating layer, and the third insulating layer comprises an organic material selected from the group consisting of polyamideimide, polyimide, polyamicacid, and fluorinated ethylene propylene.

4. The device of claim 2, wherein the thickness of each of the first insulating layer, the second insulating layer, and the third insulating layer is on the order of several to ten $\mu$m.

5. The device of claim 2, wherein the electrical component is an integrated circuit, a large integrated circuit, a resistor, a condensor, or a coil.

6. The device of claim 2, wherein the substrate comprises a layer of metal or ceramic.

* * * * *